United States Patent [19]

D'Ortenzio

[11] Patent Number: 5,825,312
[45] Date of Patent: Oct. 20, 1998

[54] DX JPEG HUFFMAN DECODER

[75] Inventor: Remo J. D'Ortenzio, Rochester, N.Y.

[73] Assignee: Xerox Corporation, Stamford, Conn.

[21] Appl. No.: 758,137

[22] Filed: Nov. 25, 1996

[51] Int. Cl.$^6$ .................................................. H03M 7/40
[52] U.S. Cl. .............................................. 341/65; 341/67
[58] Field of Search .................................. 341/65, 67, 50, 341/95

[56] References Cited

U.S. PATENT DOCUMENTS 5,254,991  10/1993  Ruetz et al. ............................... 341/65
5,325,092   6/1994  Allen et al. ............................... 341/65

Primary Examiner—Howard L. Williams
Assistant Examiner—Peguy JeanPierre
Attorney, Agent, or Firm—Robert Cunha

[57] ABSTRACT

A low cost, high speed, JPEG Huffman code decoder. The entire gamut of Huffman codes is partitioned into groups, with each group being associated with it's own small look up table to minimize the overall memory requirements. The current Huffman code is stored in a register. For the disclosed embodiment there are N=4 memories with sizes 128, 256, 128 and 256 elements respectively. For the specific typical Huffman code set cited, the partitioning is: The code words in the first group have 7 bits or less and are decoded in the first memory. The next group has from 5 to 7 leading ones, where the first five 1's are masked out and the remaining bits are used to address the second memory. The remaining codes have at least eight leading ones. Here, the first eight ones are masked out and the remaining bits are used to address the last memory. (In this example, one of the memories is not used). Finally, the first eight bits are used in a selector to enable the correct memory so that a single correct output data word is output. The disclosed N=4 embodiment is designed to handle any custom JPEG Huffman code set. This concept can be extended to other memory partitions (a N=6 example is cited) that might provide some desirable memory vs logic switching tradeoffs.

3 Claims, 2 Drawing Sheets

| RRRR / SSSS (NEX) | HUFFMAN CODE | LENGTH (BITS) (DECIMAL) | GROUP |
|---|---|---|---|
| 0/1 | 00 | 2 | A |
| 0/2 | 01 | 2 | A |
| 0/3 | 110 | 3 | A |
| 0/0 (EOB) | 1010 | 4 | A |
| 0/4 | 1011 | 4 | A |
| 1/1 | 1100 | 4 | A |
| 0/5 | 11010 | 5 | A |
| 1/2 | 11011 | 5 | A |
| 2/1 | 11100 | 5 | A |
| 3/1 | 111010 | 6 | A |
| 4/1 | 111011 | 6 | A |
| 0/6 | 1111000 | 7 | A |
| 1/3 | 1111001 | 7 | A |
| 5/1 | 1111010 | 7 | A |
| 6/1 | 1111011 | 7 | A |
| 0/7 | 11111000 | 8 | B |
| 2/2 | 11111001 | 8 | B |
| 7/1 | 11111010 | 8 | B |
| 1/4 | 111110110 | 9 | B |
| 3/2 | 111110111 | 9 | B |
| 8/1 | 111111000 | 9 | B |
| 9/1 | 111111001 | 9 | B |
| A/1 | 111111010 | 9 | B |
| 0/8 | 1111110110 | 10 | B |
| 2/3 | 1111110111 | 10 | B |
| 4/2 | 1111111000 | 10 | B |
| B/1 | 1111111001 | 10 | B |
| C/1 | 1111111010 | 10 | B |
| 1/5 | 11111110110 | 11 | B |
| 5/2 | 11111110111 | 11 | B |
| D/1 | 11111111000 | 11 | D |
| F/0 (SLR) | 11111111001 | 11 | D |
| 2/4 | 111111110100 | 12 | D |
| 3/3 | 111111110101 | 12 | D |
| 6/2 | 111111110110 | 12 | D |
| 7/2 | 111111110111 | 12 | D |
| 8/2 | 111111111000000 | 15 | D |
| 0/9 | 1111111110000010 | 16 | D |
| ● | ● | ● | ● |
| ● | ● | ● | ● |
| ● | ● | ● | ● |
| ● | ● | ● | ● |
| F/A | 1111111111111110 | 16 | D |

*FIG. 1*

DX JPEG HUFFMAN DECODER

BACKGROUND OF THE INVENTION

A circuit is defined for decoding the Huffman codes which are generated in the lossless portion of a JPEG baseline image compression system.

JPEG encoders first transform each 8×8 block of image pixels (8 bits per pixel) into an ordered array of 64 uncoded Discrete Cosine Transform (DCT) coefficients. (The inverse DCT of these coefficients would provide an exact replica of the original 8×8 block of pixels). This is followed by a normalization of these coefficients which provides a form of lossy compression by driving some of the higher frequency coefficients of the DCT (those not visually significant) to zero. The normalized coefficients are then further compressed losslessly using a JPEG Huffman coding format.

Image data is typically compressed prior to transmission or storage, using the industry standard JPEG approach. Although the specific user defined Huffman code words for any given JPEG baseline system application can vary, the number of code words is fixed at 162. Each Huffman code word can vary from 1 to 16 bits in length. Each code word represents an eight bit number RRRR/SSSS. RRRR is a four bit number representing the number of consecutive zero coefficients (in the ordered DCT array) which precede the current non-zero coefficient being decoded. SSSS is a four bit number indicating the number of bits needed to represent the numerical value of the current non-zero DCT coefficient. Compression is optimized by assigning the shorter code words to the most common RRRR/SSSS combinations. For the typical Huffman code example shown in FIG. 1, one zero coefficient followed by a coefficient whose value can be represented by a single bit (a very common occurrence), RRRR/SSSS=0001/0001, is assigned a code of 1100, while three consecutive zero coefficients followed by a three bit value (a much rarer occurrence), RRRR/SSSS=0011/0011, is assigned a code of 111111110101. The last step in developing the coded sequence is to add to the end of the code word the actual value of the current non-zero coefficient being decoded. Thus if the actual three bit number is 101 (corresponding to a coefficient value of +5), the final coded sequence is 111111110101101.

To decompress this data, the decoder must ultimately be able to convert a coded sequence like the one shown above back into the desired information, namely the number of consecutive zeroes preceding the current non-zero coefficient, and the value of the current coefficient. It must also determine how many bits to shift forward to begin decoding the next code word in the coded sequence. This is all accomplished by applying the current code word as an "address" to a lookup table which has three basic components stored within at each address, namely RRRR/SSSS/LLLL (12 bits per address). The accessed value of RRRR indicates the number of consecutive zero coefficients preceding the current non-zero coefficient. SSSS indicates the number of bits used to represent the current non-zero coefficient. LLLL indicates the number of bits contained in the current code word. The value of the current coefficient can thus be found by first shifting the input bit stream LLLL bits forward and simply interpreting the next SSSS bits in the sequence as the current non-zero coefficient's value. This would be followed by a shift of SSSS bits to align the register for decoding the next Huffman code word. Summarizing, each Huffman code word addresses a memory which stores and outputs all of the possible RRRR/SSSS/LLLL combinations. If a "brute force" lookup table approach were used, Huffman code words of up to 16 bits in length would address the memory, and the output must be 12 bits, so the required memory would be 64K by 12, or more than 90K bytes. Significant advantages would be realized if a smaller memory could be used.

SUMMARY OF THE INVENTION

This invention provides a simple, efficient, high speed method for decompressing the Huffman coded bit stream (which characterizes the normalized DCT coefficients) back to their uncoded normalized values. The conversion (decompression) is accomplished in this invention by segmenting the Huffman codes into a number of separately addressable lookup tables. This lookup table segmentation approach simplifies the circuitry involved and increases the speed of decompression. See FIGS. 1 and 2.

The disclosed embodiment of this invention divides the memory used for decompression into N=4 groups, A, B, C, and D, containing 128, 256, 128 and 256 addressable locations respectively. Each memory location contains 12 bits of data (described later). This embodiment is capable of decoding any custom Huffman code set which is constructed according to the JPEG baseline Huffman coding specification. Another possible embodiment, N=6, with memory lengths of 64, 64, 64, 64, 64 and 256 would reduce the total amount of memory required, but at the expense of more logic circuits. Other combinations are also possible.

Using the disclosed embodiment and the specific typical Huffman code table shown in FIG. 1 as examples, group A stores the outputs for all code words up to 7 bits in length. From FIG. 1, we see that these code words can be identified by the circuit as all code words having four or fewer leading 1's. In FIG. 2 we see that seven lines are used to address the Group A memory, and the output is 12 bits, so a 1,536 bit memory is required. Group B has code words having at least five leading 1's. Therefore, the first five bits can be ignored when addressing the Group B look up table. This table has 256 entries so eight bits are used for the address lines. Groups C and D have 128 and 256 memory locations, respectively. For this example, Group C is not used, and Group D has code words having 8 or more leading 1 bits. In the general case, where the Huffman code table is different from the one shown in FIG. 1, the number of leading 1's is used to determine which group the code word is in, and to the extent that all numbers in a group have at least a minimum of leading 1's, that number of bits may be ignored. The result is a greatly reduced memory requirement.

BRIEF DESCRIPTION OF THE DRAWINGS

FIG. 1 is a typical Huffman code set that can be processed by the circuit of FIG. 2.

DETAILED DESCRIPTION OF THE INVENTION

Figure 2:
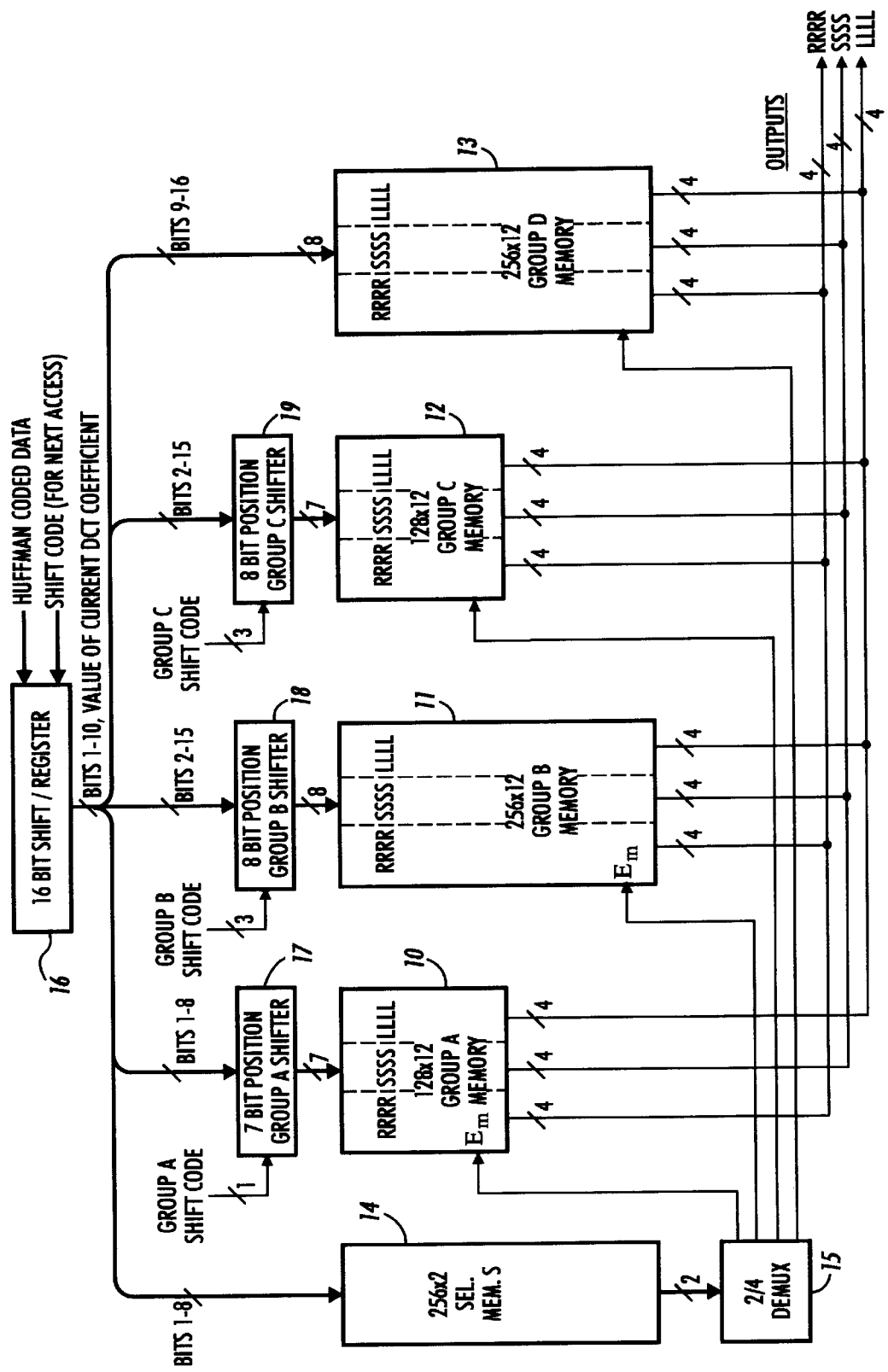
FIG. 2 is the circuit representing the disclosed embodiment for decompressing Huffman codes into RRRR/SSSS/LLLL data words.

The implementation shown in FIG. 2 is designed to decode any legitimate JPEG Huffman baseline code set. This is accomplished by pre-loading Memories 10, 11, 12, 13 and 14, with data which is appropriately matched to the specific Huffman code table being used.

The invention is best understood by describing it's operation with a specific example using the typical code set shown in FIG. 1.

In FIG. 2, the input Huffman coded data stream is shifted into the register 16 Initially, it is not known how many of the stored 16 bits represent the Huffman code. To determine this, the first 8 bits are sent to the selector 14.

For the disclosed embodiment, the Huffman codes in FIG. 1 are divided up into a maximum of four groups, where each group is associated with one of the memory units 10, 11, 12 or 13. For this specific example, only three memory groups are required, and thus no code words are assigned to Group C. The first group is assigned the first 15 entries in FIG. 1. This group is characterized by having four or less leading 1's and a total length of from two to seven bits. The first 8 bits from the register 16 are applied to the most significant address inputs to memory 14. In all cases where there are four or fewer leading 1's, the output will be a 00 which will be demultiplexed in block 15 as an enable to the group A memory 10. The other memory units 11, 12 and 13 will be disabled.

At the same time, bits 1–8 are applied to shifter 17, which is set up to apply the most significant seven bits to the group A memory 10. Shifter 17 can be set to apply bits 2–8 to the memory instead of bits 1–7, in case a customized set of Huffman codes having different properties are being used. The seven bits applied to the memory 10 address lines will result in the correct RRRR/SSSS/LLLL output from memory 10.

The last group of codes in FIG. 1 are, as shown, codes having at least eight leading 1's. In this case, bits 1–8 are applied to memory 14 and for cases where eight or more leading bits are 1's, group D memory 13 will be enabled. At the same time bits 9–16 are applied to group D memory 13 as addresses, and the appropriate 12 bit output is generated.

The last case is where there are between five and seven leading 1's. In this case, inputs within this range applied to memory 14 will result in memory 11 being enabled. Bits 2–15 are applied to the shifter 18, the first four leading 1's are shifted out and bits 6–13 are applied to memory 11.

It will be noticed that, in this described case, the third memory 12 is not used, and that more bits are applied to the shifters 17, 18, 19 than are applied to the corresponding memory units 10, 11, 12. This is because the circuit is set up to accommodate a variety of customized Huffman code tables which are optimized for different types of image data. As in any JPEG Huffman decoder, whenever a new Huffman code table is to be used, a new set of decoding parameters must be downloaded into the decoder's memories.

The next step is for the output LLLL value to be used as the shift code in to register 16 to shift the data to extract the SSSS bits which represent the value of the current coefficient being decoded. The last step is to shift SSSS bits so that the next Huffman code is aligned in the register.

The baseline JPEG Huffman code system contains 162 code words which represent the entire gamut of the RRRR/SSSS combinations. RRRR is a 4 bit number indicating the run length of zeros preceding a non-zero coefficient in any given block. SSSS is a four bit number indicating the number of bits required to represent the non-zero coefficient. RRRR can vary between 0 and 15, whereas SSSS, in the baseline system, can vary from 1 to 10. This yields 160 possible combinations. The end of block code and the ZRL, extension of the zero run length beyond 15, codes represent the remaining two codes in the total of 162.

The key element of this embodiment of the invention is the partitioning of the 162 code words in any given Huffman code set into N=4 groups, A, B, C and D. Each group has its own small look-up table to provide a high speed decoding structure to obtain the RRRR/SSSS value for each code word encountered, and a LLLL value which identifies the number of bits in the code word. Thus, each table entry is 12 bits wide. The proposed implementation recommends the memory lengths, number of entries, of the four memories associated with Groups A, B, C and D to be 128, 256, 128 and 256. These values were derived empirically after investigations of some contrived "worst case" Huffman tables. The combinations of N=3 with memory lengths of 256, 256, 256 would not satisfy some of the contrived tables. N=4 with memory lengths of 64, 256, 64 and 256 also failed. On the other hand, N=6 with memory lengths of 64, 64, 64, 64, 64 and 256 would work and reduce the memory requirements, but at the expense of more logic circuits. Based on this data, the disclosed embodiment appears to provide a good tradeoff.

While the invention has been described with reference to a specific embodiment, it will be understood by those skilled in the art that various changes may be made and equivalents may be substituted for elements thereof without departing from the true spirit and scope of the invention. In addition, many modifications may be made without departing from the essential teachings of the invention.

What is claimed is:

1. A circuit for decoding any one of the 162 possible AC codewords of any Huffman code table constructed in accordance with the JPEG baseline Huffman coding specification comprising:

a plurality of look up tables, each for outputting decoded data in response to an applied input, means for applying selected subsets of the codeword to serve as addresses to each of the look up tables, the means being adapted to change to different subsets when the input Huffman table is changed, and a selector, responsive to the codeword, for enabling one of the look up tables to output the appropriate decoded data.

2. The circuit of claim 1 wherein said circuit comprises four look up tables, two of which contain 128 entries and two of which contain 256 entries.

3. The circuit of claim 1 wherein said circuit comprises five look up tables containing 64 entries and one containing 256 entries.

* * * * *